(12) United States Patent
Preikszas et al.

(10) Patent No.: US 11,915,907 B2
(45) Date of Patent: Feb. 27, 2024

(54) METHOD FOR OPERATING A PARTICLE BEAM MICROSCOPE

(71) Applicant: Carl Zeiss Microscopy GmbH, Jena (DE)

(72) Inventors: Dirk Preikszas, Oberkochen (DE); Simon Diemer, Lauchheim (DE)

(73) Assignee: Carl Zeiss Microscopy GmbH, Jena (DE)

(*) Notice: Subject to any disclaimer, the term of this patent is extended or adjusted under 35 U.S.C. 154(b) by 120 days.

(21) Appl. No.: 17/590,148

(22) Filed: Feb. 1, 2022

(65) Prior Publication Data

US 2022/0246389 A1 Aug. 4, 2022

(30) Foreign Application Priority Data

Feb. 2, 2021 (DE) .......................... 102021102328.9

(51) Int. Cl.
*H01J 37/21* (2006.01)
*H01J 37/28* (2006.01)
(Continued)

(52) U.S. Cl.
CPC .............. *H01J 37/21* (2013.01); *H01J 37/12* (2013.01); *H01J 37/244* (2013.01); *H01J 37/28* (2013.01); *H01J 2237/04735* (2013.01)

(58) Field of Classification Search
CPC .. H01J 37/00; H01J 37/21; H01J 37/12; H01J 37/244; H01J 37/28; H01J 37/26; H01J 2237/04735; H01J 2237/216
(Continued)

(56) References Cited

U.S. PATENT DOCUMENTS 5,757,015 A * 5/1998 Takemoto .............. B82Y 10/00
250/491.1
6,838,667 B2 1/2005 Tsuneta et al.
(Continued)

FOREIGN PATENT DOCUMENTS

DE 10 2018 202 728 A1 8/2019
DE 10 2021 130 710 A1 6/2022
DE 102021130710 A1 * 6/2022

OTHER PUBLICATIONS

German Office Action, with translation thereof, for corresponding DE application No. 10 2021 102 328.9, dated Aug. 31, 2021.
(Continued)

*Primary Examiner* — Jason L McCormack
(74) *Attorney, Agent, or Firm* — Fish & Richardson P.C.

(57) ABSTRACT

A method for operating a particle beam microscopy system includes recording a first particle-microscopic image at a given first focus and varying the excitations of the first deflection device within a given first range. The method also includes changing the focus to a second focus, and determining a second range of excitations of the first deflection device on the basis of the first range, the first excitation, the second excitation and a machine parameter determined in advance. The method further includes recording a second particle-microscopic image at the second focus and varying the excitations of the first deflection device within the determined second range. The second range of excitations is determined so that a region of the object represented in the second particle-microscopic image was also represented in the first particle-microscopic image.

20 Claims, 4 Drawing Sheets

(51) Int. Cl.
*H01J 37/12* (2006.01)
*H01J 37/244* (2006.01)

(58) Field of Classification Search
USPC .......................................... 250/307, 306, 311
See application file for complete search history.

(56) References Cited

U.S. PATENT DOCUMENTS

| | | | |
|---|---|---|---|
| 2004/0188608 A1* | 9/2004 | Kaneyama | H01J 37/265 250/311 |
| 2007/0120065 A1* | 5/2007 | Takane | H01J 37/265 250/397 |
| 2007/0284542 A1* | 12/2007 | Ogashiwa | H01J 37/1471 250/491.1 |
| 2016/0163502 A1* | 6/2016 | Li | H01J 37/222 250/307 |
| 2016/0225578 A1 | 8/2016 | Preikszas | |
| 2019/0318905 A1 | 10/2019 | Preikszas et al. | |
| 2019/0362929 A1* | 11/2019 | Yamamoto | H01J 37/145 |

OTHER PUBLICATIONS

Carl Zeiss Microscopy GmbH: ΣIGMA Series—Your FE-SEM for Nanoscale Analytics, Jena, 2012, Firmenschrift.

* cited by examiner

METHOD FOR OPERATING A PARTICLE BEAM MICROSCOPE

CROSS-REFERENCE TO RELATED APPLICATION

This application claims benefit under 35 U.S.C. § 119 to German Application No. 10 2021 102 328.9, filed Feb. 2, 2021. The contents of this application is hereby incorporated by reference in its entirety.

FIELD

The present disclosure relates to methods for operating particle beam microscopes, such as, for example, particle beam microscopes in which a particle beam or a plurality of particle beams are focused at an object to be examined. An example of such a particle beam microscope is a scanning electron microscope, in which a focused electron beam can be scanned over an object to be examined and secondary electrons or backscattered electrons, generated by the incident electron beam at the object, can be detected in a manner dependent on the deflection of the focused particle beam in order to generate an electron-microscopic image of the object.

BACKGROUND

In general, a particle beam of a particle beam microscope is generated by a particle beam source, possibly passes through a condenser lens and a stigmator, and is focused at the object by an objective lens. In order to obtain a high spatial resolution of the particle beam microscope, it is usually desirable to focus the particle beam to the best reasonably possible extent at the object, i.e., a region illuminated by the focused particle beam at the surface of the object ("beam spot") is as small as reasonably possible. In practice, this is commonly achieved by virtue of a user manually setting the focus of the particle beam by operating actuating elements and the controller of the particle beam microscope changing the excitation of the objective lens on the basis of the operation of the actuating elements. During this adjustment process, the particle beam is typically scanned continuously over the object in order to record images. The user can assess the quality of the generated images by comparison and, in a manner dependent thereon, can actuate the actuating elements until they are satisfied with the quality of the images or can no longer improve the quality thereof. This procedure can place significant demands even on skilled users.

SUMMARY

The present disclosure proposes a method for operating a particle beam microscope which can simplify focusing a particle beam at an object to be examined.

According to embodiments of the disclosure, provision is made for a method for operating a particle beam microscope which includes: a particle beam source for generating a particle beam, an objective lens for focusing the particle beam on an object and a first deflection device for scanning the particle beam over the object. The particle beam microscopy system is configured to record particle-microscopic images by virtue of the particle beam being scanned over the object via the first deflection device, wherein excitations of the first deflection device are varied within a range. The method then includes a recording of a first particle-microscopic image at a given first focus and variation of the excitations of the first deflection device within a given first range, a change in the focus to a second focus; a determination of a second range of excitations of the first deflection device on the basis of the first range, the first focus, the second focus and a machine parameter determined in advance; and a recording of a second particle-microscopic image at the second focus and variation of the excitations of the first deflection device within the determined second range. In this case, the second range of excitations may be determined in such a way that a region of the object represented in the second particle-microscopic image was also represented in the first particle-microscopic image.

A difficulty when operating a conventional particle beam microscope can lie in the fact that changes in the focus of the particle beam in many cases also lead to an offset of the images recorded before and after the change in the focus. This image offset can make it difficult to compare the images recorded before and after the change in focus since the objects represented in the images are represented at different locations in the image recorded after the change in focus and in the image recorded before the change in focus.

Using the method described herein, it is possible to avoid this image offset by virtue of the range over which the excitation of the first deflection device is varied when recording an image also being changed when changing the focus. The change in the range over which the excitation of the first deflection device is varied when recording an image can be implemented, for example, in such a way here that the above-described image offset is at least partly compensated and is not perceived or hardly perceived by the user when observing the images. Hence, it can be possible for the user to compare the two images recorded before and after the change in focus more easily and, for example, more easily assess a difference in the two images in respect of image sharpness.

According to exemplary embodiments, determining the second range of excitations includes a determination of an expected image offset on the basis of the first focus, the second focus and the machine parameter. Then, determining the second range of excitations of the first deflection device can be based on the first range of excitations of the first deflection device and the determined image offset.

According to exemplary embodiments, the machine parameter represents a size of an image offset per excitation change in the objective lens.

According to exemplary embodiments, the machine parameter represents a size of an image offset per change in voltage of a high voltage for accelerating the particles of the particle beam.

According to exemplary embodiments, the method also includes a determination of the machine parameter. Determining the machine parameter can include a recording of two particle-microscopic images with different focuses, a determination of an image offset between the two particle-microscopic images from the two particle-microscopic images, and a determination of the machine parameter on the basis of the determined image offset and a difference between the two different focuses.

The machine parameter determined in this way can subsequently be used to compensate or avoid an image offset accompanying changes in the focus. The same machine parameter can be used for a plurality of successive changes in the focus, that is to say can be used multiple times. By way of example, the machine parameter can be determined at predetermined time intervals, for example hourly or daily, or every time the particle beam microscopy system has been put into operation. In this case it is possible to determine a respective machine parameter for different settings of parameters of the particle beam microscopy system, that is to say to parameterize the machine parameter itself. An example of such a parameter is the kinetic energy of the particles of the particle beam when passing through the objective lens, which is determined by an acceleration voltage of the particle beam, for example. Thus, the machine parameter can be determined for different values of the acceleration voltage. To compensate the image offset in the case of a change in focus, it is then possible to use the machine parameter which was determined at the acceleration voltage equal to or not very different from the current acceleration voltage. The focus itself can also be such a parameter. For example, the excitation of the objective lens can be such a parameter for this reason. By way of example, the strength of the current in ampere fed to the objective lens for excitation purposes can be used as the parameter in this respect.

According to exemplary embodiments, changing the focus includes changing an excitation of the objective lens, and the machine parameter can represent a size of an image offset per excitation change in the objective lens.

According to exemplary embodiments, the objective lens provides a focusing magnetic field, and the change in the focus can include a change in an electric current fed to a coil of the objective lens. According to exemplary embodiments herein, the objective lens can further provide a focusing electrostatic field.

According to exemplary embodiments, the particle beam microscopy system further includes a second deflection device for displacing the particle beam within the objective lens, and the method further includes a setting of the excitations of the second deflection devices such that the particle beam passes through the objective lens substantially centrally. In the case of such a setting of the excitation of the second deflection device it is possible to obtain relatively good focus of the particle beam at the object, that is to say it is possible to obtain a relatively small beam spot on the object.

According to exemplary embodiments, setting the excitations of the second deflection devices includes a recording of two particle-microscopic images with different focuses of the particle beam microscopy system, a determination of an image offset between the two particle-microscopic images from the two particle-microscopic images, and a setting of the excitations of the second deflection devices such that the determined image offset is substantially zero. In the changes in the focus undertaken for setting the excitations of the second deflection devices, the above-described compensation of the image offset by changing the range of the variation of the excitations of the first deflection device is not used since the arising image offset is the subject of an optimization and should disappear.

Following such an adjustment of the excitations of the second deflection devices, it is possible that no image offsets would occur any more in the case of subsequent changes in the focus in the case of an ideal objective lens, in which case the above-described compensation of the image offset by changing the range of the variation of the excitations of the first deflection device would not be required. However, this is frequently not the case in practice, for example because the geometry of the objective lens is not ideal. By way of example, if the objective lens provides a focusing magnetic field and a focusing electric field, these two fields might not be centred relative to one another on account of the imperfect geometry of the objective lens. For given excitations of the focusing magnetic field and the focusing electric field, it is then possible to initially find advantageous excitations of the second deflection device using the above-described method. By way of example, the kinetic energy of the particles of the particle beam can be changed in the process for the purposes of attaining the different focuses. However, if the focus is subsequently changed, for example by virtue of changing the focusing magnetic field, an unwanted image offset can be generated again, the latter being able to be compensated by virtue of adjusting the range of excitations of the first deflection device on the basis of the machine parameter.

The disclosure further includes a particle beam microscopy system which is configured to carry out the above-described method.

Further, the disclosure includes a computer program product including instructions that, upon execution by a controller of a particle beam microscopy system, cause the latter to carry out the above-described method.

BRIEF DESCRIPTION OF THE DRAWINGS

Embodiments of the disclosure are explained in greater detail below with reference to figures, in which.

DESCRIPTION OF EXEMPLARY EMBODIMENTS

Figure 1:
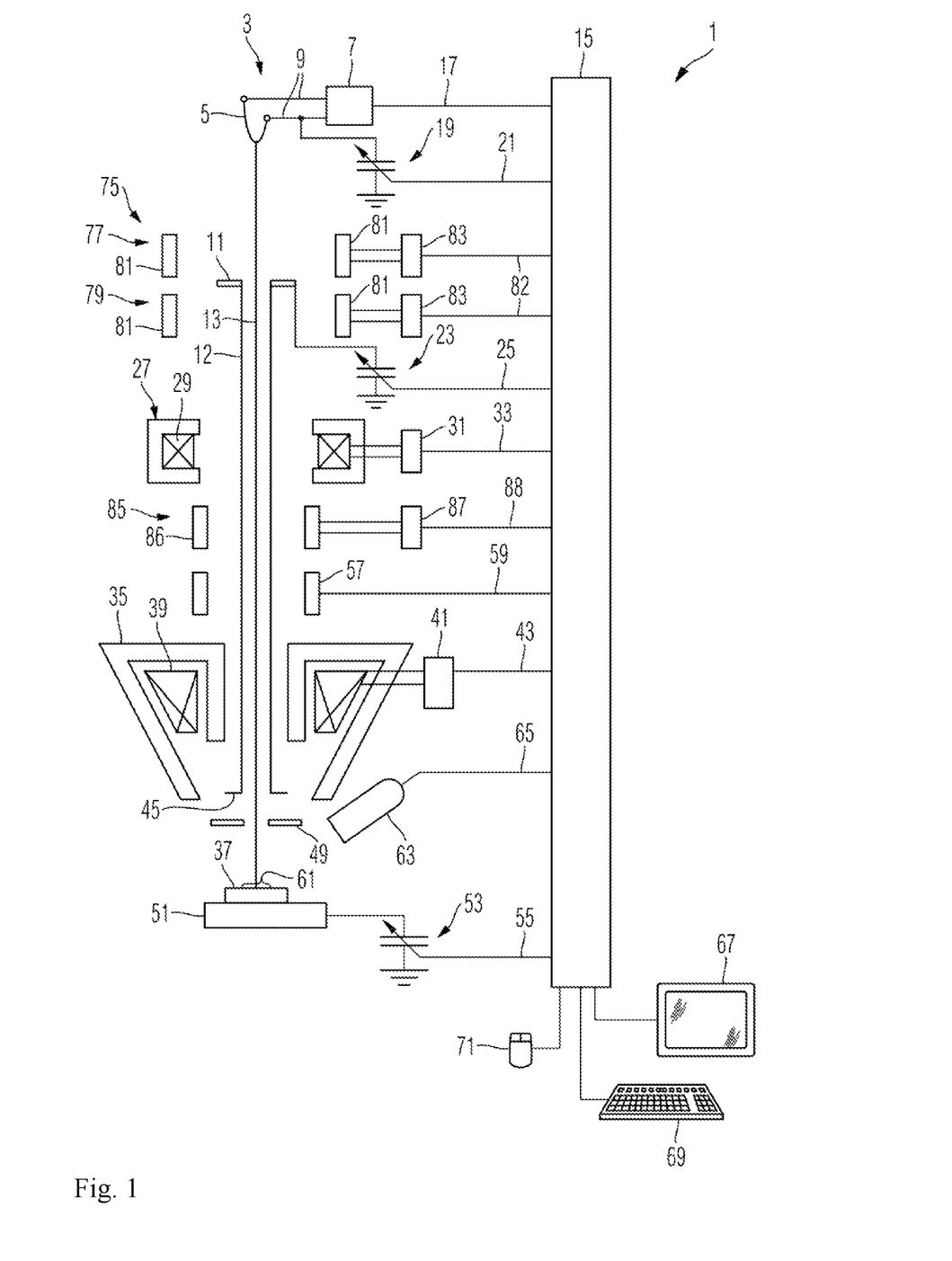
FIG. 1 shows a schematic illustration of a particle beam microscopy system.

FIG. 1 is a schematic illustration of a particle beam microscopy system 1, which can be operated using a method according to embodiments of the disclosure. The particle beam microscopy system 1 includes a particle source 3 including a particle emitter 5 and a driver 7. By way of example, the particle emitter 5 can be a cathode heated by the driver 7 by way of lines 9, said cathode emitting electrons which are accelerated away from the emitter 5 by an anode 11 and shaped to form a particle beam 13. To this end, the driver 7 is controlled by a controller 15 of the particle beam microscope 1 by way of a control line 17 and an electric potential of the emitter is set by way of an adjustable voltage source 19, which is controlled by the controller 15 by way of a control line 21. An electric potential of the anode 11 is set by way of an adjustable voltage source 23, which is likewise controlled by the controller 15 by way of a control line 25. A difference between the electric potential of the emitter 5 and the electric potential of the anode 11 defines the kinetic energy of the particles of the particle beam 13 after passing through the anode 11. The anode 11 forms the upper end of a beam tube 12, into which the particles of the particle beam 13 enter after passing through the anode 11.

The particle beam 13 passes through a condenser lens 27 which collimates the particle beam 13. In the illustrated example, the condenser lens 27 is a magnetic lens with a coil 29, which is excited by a current generated by an adjustable current source 31 controlled by the controller 15 by way of a control line 33.

The particle beam 13 thereupon passes through an objective lens 35, which should focus the particle beam 13 at a surface of an object 37 to be examined. In the illustrated example, the objective lens 35 includes a magnetic lens, the magnetic field of which is generated by a coil 39, which is excited by a current source 41 controlled by the controller 15 by way of a control line 43. The objective lens 35 further includes an electrostatic lens, the electrostatic field of which is generated between a lower end 45 of the beam tube 12 and an electrode 49. The beam tube 12 is electrically connected to the anode 11 and the electrode 49 can be electrically connected to the earth potential or be set to a potential different from earth via a further voltage source (not illustrated in FIG. 1) controlled by the controller 15.

The object 37 is held on an object holder 51, the electric potential of which is set by way of a voltage source 53 controlled by the controller 15 by way of a control line 55. The object 37 is electrically connected to the object holder 51, and so the object 37 also has the electric potential of the object holder 51. A difference between the electric potential of the particle emitter 5 and the electric potential of the object 37 defines the kinetic energy of the particles of the beam 13 when incident on the object 37. Compared thereto, the particles may have greater kinetic energy within the beam tube 12 and when passing through the condenser lens 27 and the objective lens 35 if they are decelerated by the electrostatic field between the end 45 of the beam tube 12 and the electrode 49 and/or by an electric field between the electrode 49 and the object 37. However, it is also possible to embody the particle beam microscope 1 without beam tube 12 and electrode 49, and so the particles are decelerated or accelerated by an electric field between the anode 11 and the object 37 prior to being incident on the object 37. Independently of the embodiment of the particle beam microscope 1 with or without beam tube 12 and independently of the embodiment and arrangement of the electrode 49, the kinetic energy of the particles when incident on the object 37 is only dependent on the difference between the potentials of the particle source 3 and of the object 37.

The particle beam microscope 1 furthermore includes a deflection device 57 which is controlled by the controller 15 by way of a control line 59 and which deflects the particle beam 13 such that the particle beam 13 can scan a region 61 on the object 37 under control by the controller 15. The particle beam microscope 1 further includes a detector 63, which is positioned in such a way that signals which are generated by the particle beam 13 directed at the object 37 and which leave the object are able to be incident on the detector 63 in order to be detected by the latter. These signals can include particles such as, for instance, backscattered electrons and secondary electrons or radiation such as, for instance, cathodoluminescence radiation.

In the particle beam microscope 1 illustrated in FIG. 1, the detector 63 is a detector arranged next to the objective lens 35 and in the vicinity of the object. However, it is also possible for the detector to be arranged in the beam tube 12 or at any other suitable position. For example, if an electric field at the surface of the object has a decelerating effect on the incident electrons of the particle beam 13, secondary electrons leaving the object at low velocity are accelerated into the beam tube by this electric field and become detectable by a detector arranged in the beam tube 12 (not illustrated in FIG. 1).

The particles emanating from the object 37 are caused by the particle beam 13 incident on the object 37. For example, these detected particles can be particles of the particle beam 13 itself, which are scattered or reflected at the object 37, such as, e.g., backscattered electrons, or they can be particles which are separated from the object 37 by the incident particle beam 13, such as e.g. secondary electrons. However, the detector 63 can also be embodied in such a way that it detects radiation, such as e.g. X-ray radiation, which is generated by the particle beam 13 incident on the object 37. Detection signals from the detector 63 are received by the controller 15 by way of a signal line 65. The controller 15 stores data, derived from the detection signals, in a manner dependent on the current setting of the deflection device 57 during a scanning process, and so these data represent a particle beam-microscopic image of the region 61 of the object 37. This image can be displayed by a display apparatus 67 connected to the controller 15 and observed by a user of the particle beam microscope 1.

The particle beam microscope 1 further includes a deflection device 75, which is arranged in the beam path of the particle beam 13 between the particle beam source 3 and the objective lens 35. In the example shown in FIG. 1, the deflection device 75 is arranged in the region of the anode 11; however, it could also be arranged between the particle beam source 3 and the anode 11, between the anode 11 and the condenser 27 or the objective lens 35, or between the condenser 27 and the objective lens 35. In the illustrated example, the deflection device 75 is a double deflector which includes two individual deflectors 77 and 79 arranged in succession in the beam path of the particle beam 13, said individual deflectors each having a plurality of deflection elements 81 arranged in distributed fashion in the circumferential direction around the particle beam 13. The deflection elements 81 can be formed by electrodes and/or coils, the excitation of which is provided by voltage or current sources 83, which are controlled by the controller 15 by way of lines 82. Each individual deflector 77, 79 of the double deflector 75 is configured to deflect, in an adjustable direction and through an adjustable angle, the particle beam 13 passing through the respective individual deflector. By way of example, if the deflection elements 81 of an individual deflector 77, 79 are electrodes, four electrodes arranged in distributed fashion in the circumferential direction around the particle beam 13 can be provided to this end, for example. By way of example, if the deflection elements 81 are coils, eight coils arranged in the circumferential direction around the particle beam 13 can be provided, for example.

The deflection device 75 can be used to adjust the particle beam 13; i.e., before the beam passes through the objective lens 35, said beam is aligned in such a way that the beam can be focused to the best possible extent at the object 37 by the objective lens 35. By way of example, the excitations of the deflection device 75 can be set in such a way that the particle beam 13 passes through a principal plane of the objective lens 35 along an optical axis in the objective lens 35.

The particle beam microscopy system 1 further includes a stigmator 85, which includes a plurality of stigmator elements 86 arranged in distributed fashion in the circumferential direction about the particle beam 13, the excitation of said stigmator elements being provided by a driver circuit 87, which is controlled by the controller 15 by way of a control line 88. The stigmator 85 is configured to provide an electric or magnetic quadrupole field, the magnitude and orientation of which is adjustable.

Images recorded by way of the particle beam microscopy system 1 can be displayed on a screen 76. The user of the particle beam microscopy system 1 can control the latter and, for example, the start of the focusing method by way of operating elements, for instance a keyboard 69 and a mouse 71, and a user interface, which is displayed on the screen.

Figure 2:
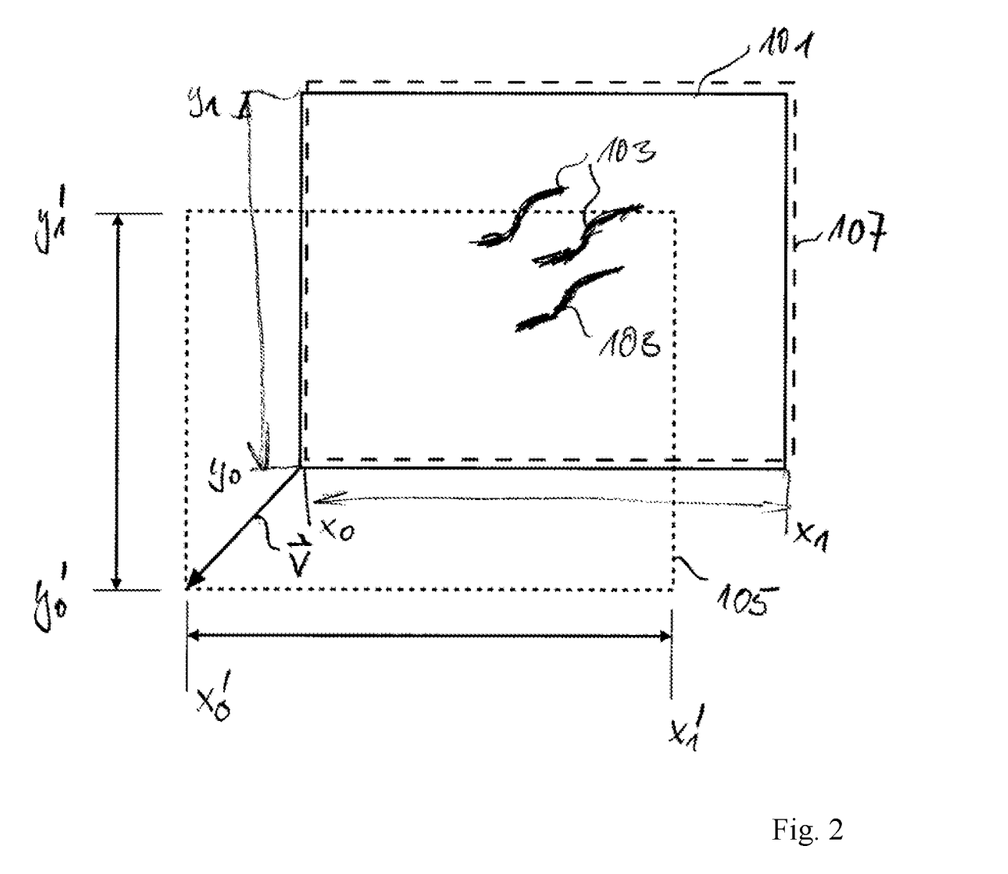
FIG. 2 shows a schematic illustration for explaining an image offset which may occur in the particle beam microscopy system of FIG. 1 in the case of focus changes.

FIG. 2 is a schematic illustration for explaining an image offset which may occur in the particle beam microscopy system of FIG. 1 in the case of focus changes.

As described above, it is sometimes desirable to change the focus during the operation of the particle beam microscopy system. By way of example, this can occur if the object 37 to be examined was displaced laterally relative to the objective lens 35 by the object holder 51. On account of unevenness of the object 37 and/or shortcomings in the lateral displacement by the object holder 51, the situation where the particle beam 13 is no longer focused perfectly at the surface of the object 37 and the image becomes blurred may arise. Accordingly, the focus of the objective lens 35 is altered until the image is sharp again.

In FIG. 2, a rectangle 101 drawn with a solid line represents the particle-microscopic image as recorded with a set first focus before the change in the focus. The image is generated by virtue of the particle beam being scanned over a region of the object whose left edge is denoted by xo in FIG. 2, whose right edge is denoted by xi in FIG. 2, whose lower edge is denoted by $y_0$ in FIG. 2 and whose upper edge is denoted by $y_1$ in FIG. 2. The scanning of this region is attained by virtue of the excitations fed to the deflection device 57 being varied. By way of example, the particle beam 13 is directed at the left edge xo on the object 37 when a current of for example −100 µA is fed to the deflection element of the deflection device 57 for the purposes of generating the deflection in the x-direction while the beam is directed at the right edge xi when a current of for example +100 µA is fed to this deflection element. Similarly, the particle beam 13 is directed at the lower edge $y_0$ on the object 37 when a current of for example −75 µA is fed to the deflection element of the deflection device 57 for the purposes of generating the deflection in the y-direction while the beam is directed at the upper edge $y_1$ when a current of for example +75 µA is fed to this deflection element. The values specified here for the currents fed to the deflection element are merely exemplary. In fact, these currents are dependent on the magnification of the microscope to be achieved. In the case of a smaller magnification to be attained, the current for generating the deflection in the x-direction can be varied between −1 A and +2 A, for example Representations of structures 103 of the object 37 are recognizable in the image 101 recorded with the first focus. If the user is of the opinion that the representation of these structures 103 is blurred and a sharper representation could be achieved by changing the focus, they will change the excitation of the objective lens 37 on a trial basis. A rectangle 105 represented by dashed lines in FIG. 2 represents the recorded and displayed particle-microscopic image following the change in the focus from the first focus to a second focus differing therefrom. On account of the imperfect adjustment of the particle beam microscopy system before the change in the focus, the change in the focus not only leads to the sharpness of the represented structures 103 changing on account of the change in focus. The change in the focus also leads to an image offset occurring between the images 101 and 105. The image offset is represented by a vector $\vec{V}$ in FIG. 2 and can for example be specified in the unit of length of metres on the object if the magnification of the image 101 is known.

The user carries out the change in the focus for the purposes of improving the sharpness of the representation of the structures 103. To this end, they have to compare the structures 103 represented before the change in the focus to the structures 103 represented after the change in the focus. In the example illustrated in FIG. 2 for the purposes of explaining the image offset, the structures 103 are represented approximately in the centre of the image 101 recorded before the change in focus while in the image 105 recorded after the change in the focus they are represented in the top right corner of the image and are partly even no longer visible in the image 105. On account of this displacement of the illustrated structures 103 in the images, it is difficult for the user to assess an improvement in the image sharpness between the changes in the focus.

When recording the image 105 after the change in focus, the deflection device 57 is excited in exactly the same way as during the recording of the image 101 before the change in the focus. On account of the image offset, the left edge on the object 37 is at $x'_0$, the right edge is at $x'_1$, the lower edge is at $y'_0$ and the upper edge is at $y'_1$ on the object. If the magnification is known, it is possible to find out by way of measurement that the displacement $\vec{V}$ is −50 nm in the x-direction and −10 nm in the y-direction, for example.

According to the method described here, the image offset $\vec{V}$ can be avoided if the range over which the excitations of the deflection device 57 when scanning the object are varied is changed in order to record an image 107 after the change in the focus which is represented by a dashed rectangle in FIG. 2 and which substantially coincides on the object 37 with the image 101 before the change in the focus. By way of example, under the assumption of the aforementioned exemplary excitations of the deflection elements of the deflection device 57, this can be achieved by virtue of the deflection element being excited with −50 µA for the purposes of generating the deflection in the x-direction in order to direct the beam at the left edge xo and being excited with +150 µA in order to direct the particle beam at the right edge xi. Accordingly, the deflection element for generating the deflection in the y-direction can be excited with −65 µA in order to direct the beam at the lower edge $y_0$ and it can be excited with +85 µA in order to direct the particle beam at the upper edge $y_1$.

If the displacement $\vec{V}$ generated per change in the excitation of the objective lens is known, this change in the range over which the excitation of the deflection device 57 is changed in order to record an image can be carried out automatically in order to compensate the image offset actually caused by the change in the focus. As a result, it is easier for the user to assess the success of the change in the focus on the basis of the structures 105 of the object 37 represented in the image since these structures remain stationary on, for example, a monitor for displaying the images 101 and 107.

The method described above is explained once again in summarized form below with reference to FIG. 3. In a step 131, the user chooses a setting for a range within which the excitation of the deflection device 57 is varied for the purposes of recording an image, and chooses a first setting for the focus. An image 101 is recorded and displayed in a step 133. The user assesses the representation in respect of its sharpness. If they are not satisfied, they change the focus in a step 135 by virtue of setting a second focus. In order to compensate the image offset actually setting in with the change in the focus, the range over which the excitations of the deflection device 57 are varied for the purposes of recording the image is changed in a step 137. The change is based on the value of the first excitation of the objective lens before the change in focus, the value of the second excitation of the objective lens after the change in focus and a machine parameter. For example, the machine parameter represents the image offset $\vec{V}$ generated per change in the focus if the image offset is not compensated.

The method then returns to step 133, in which a new image is recorded and displayed. The user can then decide whether further focus changes are carried out and the loop of steps 135, 137 and 133 is run through again, or whether the method is terminated.

Figure 3:
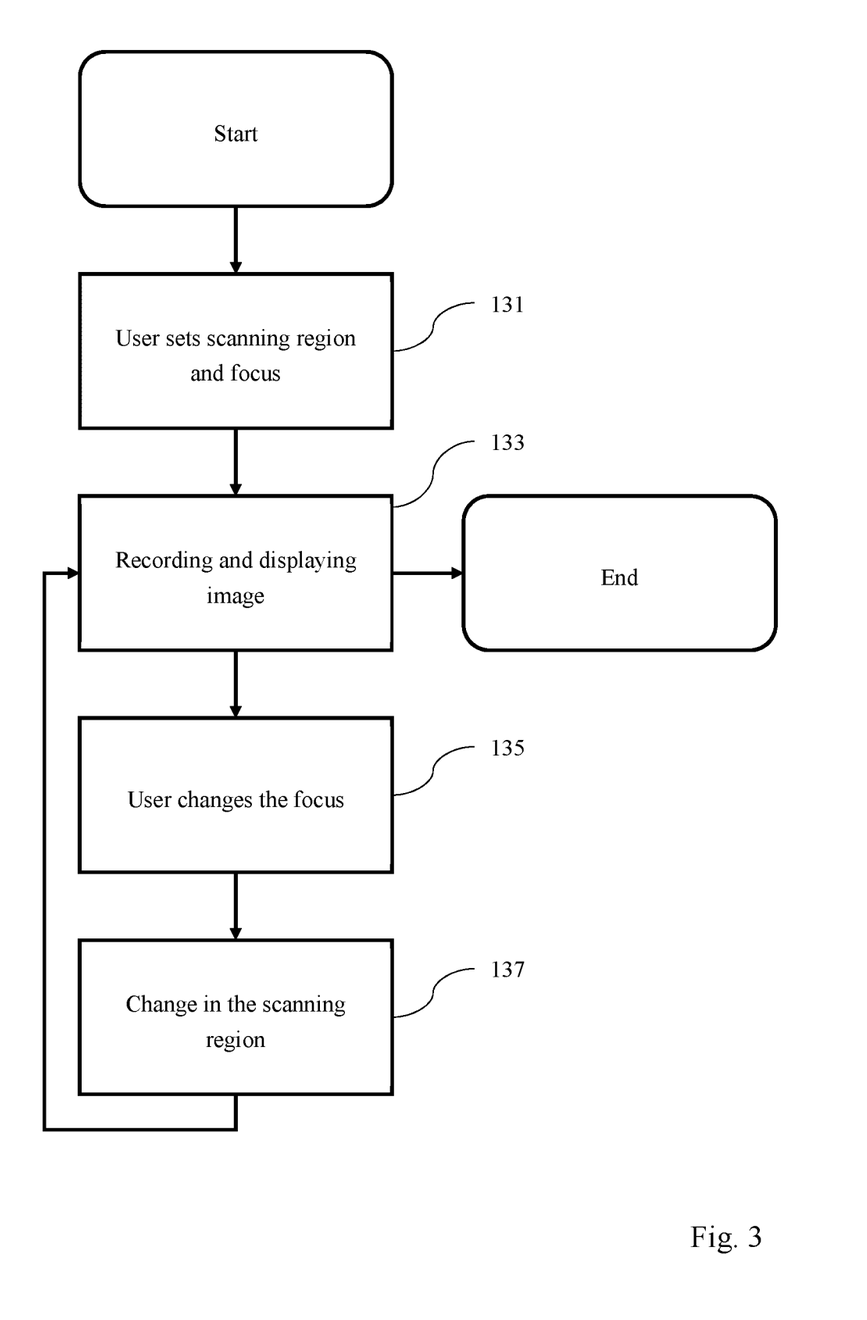
FIG. 3 shows a flowchart for explaining a method for compensating the image offset of FIG. 2 in the case of focus changes.

A method for determining the machine parameter used in step 137 of FIG. 3 is explained below on the basis of FIG. 4. The scanning region for recording an image is set in a step 151 by virtue of setting the range over which the excitations of the deflection device 57 are varied for the purposes of recording the image. Further, an excitation of the objective lens is set to the first value in step 151 in order to achieve a given focus. Thereupon, a first image is recorded and stored in a step 153. The excitation of the objective lens is changed by a certain amount in a step 155, whereupon a second image is recorded in a step 157. The image offset between the first image recorded in step 153 and the second image recorded in step 157 is determined in a step 159. By way of example, the image offset can be determined in metres on the object in the x- and y-direction. Then, the machine parameter is determined in a step 161 from the image offset and the first excitation of the objective lens set in step 151 and the second excitation of the objective lens set in step 155. The machine parameter determined in step 161 of FIG. 4 can be determined, for example, by virtue of dividing the image offset, measured in metres, determined in step 159 by the change in the excitation of the objective lens, measured in ampere, between steps 151 and 155.

The image offset can be determined using known processes of image processing, for example cross-correlation.

Figure 4:
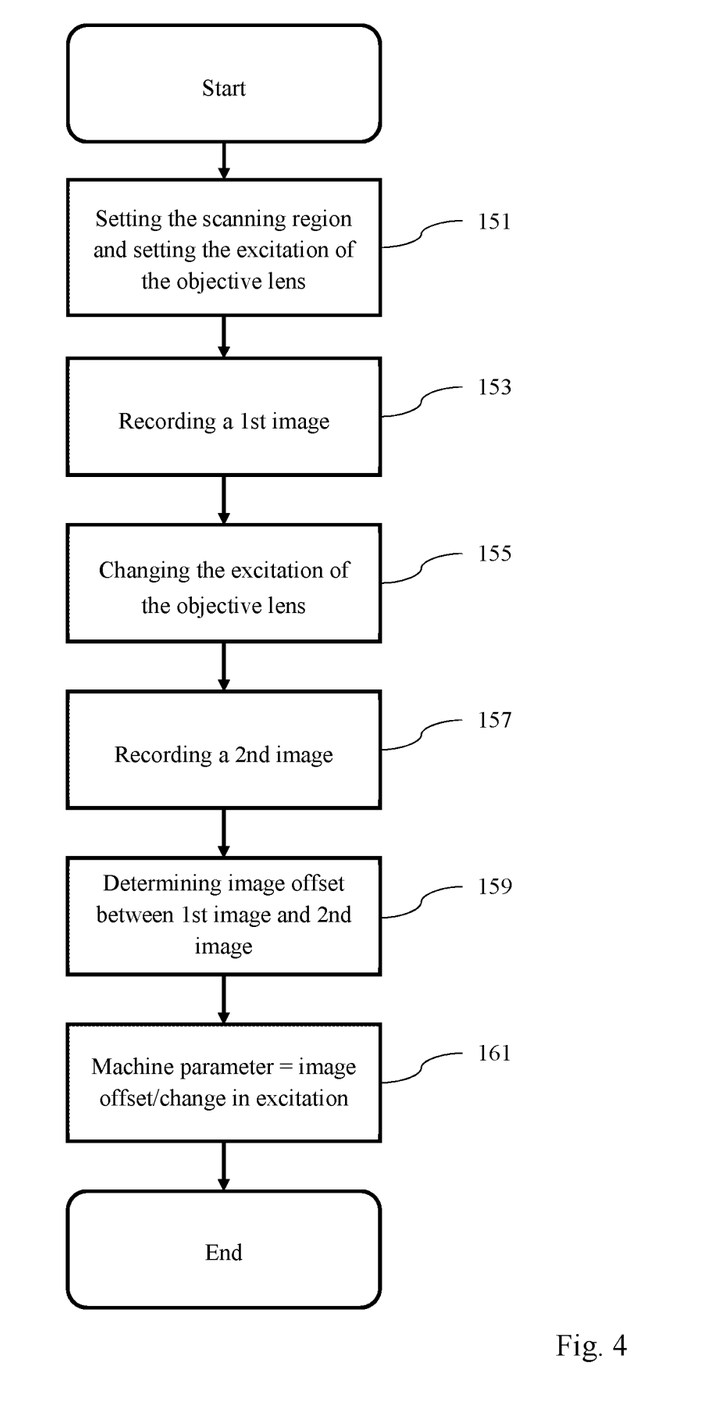
FIG. 4 shows a flowchart for explaining a method for determining a machine parameter for the method of FIG. 3.

Before accurately setting the focus using the method explained on the basis of FIG. 4, the particle beam microscope can be adjusted by virtue of the deflection device 75 being excited such that the particle beam 13 is aligned relative to the objective lens 35 in view of the best possible focus. It is possible, to this end, to apply a suitable known method which for example performs so-called "wobbling" of the particle beam. A further example of a suitable method has been disclosed in the German patent application DE 10 2021 130 710 A1.

The method of FIG. 4 for determining a current machine parameter can be carried out automatically at regular intervals. Further, it is possible for the method of FIG. 4 to be carried out for different settings of the particle microscopy system 1 and for the respectively ascertained machine parameter to be stored together with the settings. For various settings of the particle microscopy system undertaken by the user, it is subsequently possible on the basis of the settings to use the respective matching machine parameter, which was determined in advance, or the machine parameter, which was determined in advance, closest to the settings in order to compensate image offsets when the focus is changed.

In the embodiments described above, the change in the focus is brought about by changing the excitation of the objective lens. However, it is additionally or alternatively possible to bring about the change in the focus by changing a high voltage for accelerating the particles of the particle beam. By way of example, the acceleration voltage applied to the anode 11 can be changed to this end. For example, the above-described machine parameter represents the image offset $\vec{V}$ generated per change in the high voltage if the image offset is not compensated.

The particle beam device is an electron microscope in the above-described embodiments. However, the disclosure is also applicable to other particle beam devices. Examples thereof include: an ion beam device and a combination of an ion beam device and an electron beam device, in which a location on an object can be irradiated both by an ion beam generated by the ion beam device and by one generated by the electron beam device. Further, the particle beam device can also be a multibeam particle beam device, in which a plurality of particle beams are directed in parallel next to one another at an object.

What is claimed is:

1. A method of using a particle beam microscopy system comprising a particle beam source for generating a particle beam, an objective lens for focusing the particle beam on an object and a first deflection device for scanning the particle beam over the object, the particle beam microscopy system being configured to record particle-microscopic images by virtue of using the first deflection device to scan the particle beam over the object, the method comprising:
    recording a first particle-microscopic image at a first focus and varying the excitations of the first deflection device within a first range;
    changing from the first focus to a second focus;
    determining a second range of excitations of the first deflection device on the basis of the first range, the first focus, the second focus and a machine parameter determined in advance; and
    recording a second particle-microscopic image at the second focus and varying the excitations of the first deflection device within the second range,
    wherein the second range of excitations is determined so that a region of the object represented in the second particle-microscopic image is also represented in the first particle-microscopic image.

2. The method of claim 1, wherein the machine parameter represents a size of an image offset per change in the focus.

3. The method of claim 1, wherein:
    determining the second range of excitations comprises determining an expected image offset on the basis of the first focus, the second focus and the machine parameter; and
    determining the second range of excitations of the first deflection device is based on the first range of excitations of the first deflection device and the determined expected image offset.

4. The method of claim 1, wherein changing the focus comprises changing an excitation of the objective lens.

5. The method of claim 4, wherein the machine parameter represents a size of an image offset per excitation change in the objective lens.

6. The method of claim 1, wherein changing the focus comprises changing a high voltage for accelerating the particles of the particle beam.

7. The method of claim 6, wherein the machine parameter represents a size of an image offset per change in voltage of the high voltage.

8. The method of claim 1, further comprising determining the machine parameter by a method comprising:
    recording two particle-microscopic images with different focuses;
    determining an image offset between the two particle-microscopic images from the two particle-microscopic images; and
    determining the machine parameter on the basis of the determined image offset and a difference between the two different focuses.

9. The method of claim 1, wherein the objective lens provides a focusing magnetic field, and the change in focus comprises a change in an electric current fed to a coil of the objective lens.

10. The method of claim 9, wherein the objective lens further provides a focusing electrostatic field.

11. The method of claim 1, wherein the particle beam microscopy system further comprises a second deflection device configured so that the particle beam is displaced within the objective lens, and the method further comprises setting the excitations of the second deflection device such that the particle beam passes through the objective lens substantially centrally.

12. The method of claim 11, wherein setting the excitations of the second deflection device comprises:
   recording two particle-microscopic images with different focuses of the particle beam microscopy system;
   determining an image offset between the two particle-microscopic images from the two particle-microscopic images; and
   setting the excitations of the second deflection device such that the determined image offset is substantially zero.

13. The method of claim 12, wherein the two different focuses are set by changing a kinetic energy of the particles of the particle beam when passing through the objective lens.

14. The method of claim 1, wherein:
   the machine parameter represents a size of an image offset per change in the focus
   determining the second range of excitations comprises determining an expected image offset on the basis of the first focus, the second focus and the machine parameter; and
   determining the second range of excitations of the first deflection device is based on the first range of excitations of the first deflection device and the determined expected image offset.

15. The method of claim 1, wherein the machine parameter represents a size of an image offset per change in the focus, and changing the focus comprises changing an excitation of the objective lens.

16. The method of claim 1, wherein the machine parameter represents a size of an image offset per change in the focus, and changing the focus comprises changing a high voltage for accelerating the particles of the particle beam.

17. The method of claim 1, wherein the machine parameter represents a size of an image offset per change in the focus, and the method further comprises determining the machine parameter by a method comprising:
   recording two particle-microscopic images with different focuses;
   determining an image offset between the two particle-microscopic images from the two particle-microscopic images; and
   determining the machine parameter on the basis of the determined image offset and a difference between the two different focuses.

18. The method of claim 1, wherein the machine parameter represents a size of an image offset per change in the focus, the objective lens provides a focusing magnetic field, and the change in focus comprises a change in an electric current fed to a coil of the objective lens.

19. One or more machine-readable hardware storage devices comprising instructions that are executable by one or more processing devices to perform operations comprising the method of claim 1.

20. A system comprising:
   one or more processing devices; and
   one or more machine-readable hardware storage devices comprising instructions that are executable by the one or more processing devices to perform operations comprising the method of claim 1.

* * * * *

UNITED STATES PATENT AND TRADEMARK OFFICE
CERTIFICATE OF CORRECTION

PATENT NO. : 11,915,907 B2
APPLICATION NO. : 17/590148
DATED : February 27, 2024
INVENTOR(S) : Dirk Preikszas and Simon Diemer

Page 1 of 1

It is certified that error appears in the above-identified patent and that said Letters Patent is hereby corrected as shown below:

In the Specification

Column 7, Line 44, after "example" add --.--.

Signed and Sealed this
Twenty-third Day of April, 2024

Katherine Kelly Vidal
*Director of the United States Patent and Trademark Office*